(12) United States Patent
Patten

(10) Patent No.: US 12,740,483 B2
(45) Date of Patent: Sep. 15, 2026

(54) ELECTRONIC CIRCUIT FABRICATION

(71) Applicant: Cirrus Logic International Semiconductor Ltd., Edinburgh (GB)

(72) Inventor: David Patten, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 514 days.

(21) Appl. No.: 18/308,885

(22) Filed: Apr. 28, 2023

(65) Prior Publication Data

US 2024/0128235 A1 Apr. 18, 2024

Related U.S. Application Data

(60) Provisional application No. 63/339,076, filed on May 6, 2022.

(30) Foreign Application Priority Data

Sep. 15, 2022 (GB) ..................................... 2213545

(51) Int. Cl.
*H01L 25/065* (2023.01)
*H10W 74/01* (2026.01)
(Continued)

(52) U.S. Cl.
CPC ........... *H10W 90/00* (2026.01); *H10W 74/01* (2026.01); *H10W 74/111* (2026.01);
(Continued)

(58) Field of Classification Search
CPC ...... H01L 21/56; H01L 23/3107; H01L 24/16
See application file for complete search history.

(56) References Cited

U.S. PATENT DOCUMENTS 10,658,334 B2 * 5/2020 Cheng ................. H01L 25/0657
12,136,597 B2 * 11/2024 Tsai .................... H10W 70/614
(Continued)

FOREIGN PATENT DOCUMENTS

TW 202022959 A 6/2020
TW 202025439 A 7/2020

OTHER PUBLICATIONS

Combined Search and Examination Report under Sections 17 and 18(3), UKIPO, Application No. GB2213545.3, mailed Mar. 7, 2023.
(Continued)

*Primary Examiner* — Thao P Le
(74) *Attorney, Agent, or Firm* — Jackson Walker L.L.P.

(57) ABSTRACT

This application describes electronic circuit packages and methods of manufacture. The package (100, 300) includes a primary integrated circuit die (101) with a smaller secondary integrated circuit die (102) attached to a first surface of the primary integrated circuit die in a first location. A first set of electrical connectors (103) extend from the first surface of the primary integrated circuit die outside the first location to a package connection layer (106) to provide electrical connection between the package connection layer and the primary integrated circuit die. An intermediate layer (108) of dielectric or insulating material extends between the primary integrated circuit die and the package connection layer so that the dielectric or insulating material surrounds the first set of electrical connectors and there is at least some dielectric or insulating material between the second integrated circuit die and the package connection layer.

4 Claims, 3 Drawing Sheets

(51) Int. Cl.
*H10W 74/10* (2026.01)
*H10W 90/00* (2026.01)
*H10W 72/00* (2026.01)

(52) U.S. Cl.
CPC ........ *H10W 72/877* (2026.01); *H10W 90/724* (2026.01); *H10W 90/732* (2026.01)

(56) References Cited

U.S. PATENT DOCUMENTS

| | | | | |
|---|---|---|---|---|
| 12,519,084 | B2 * | 1/2026 | Pasdast | H10W 90/00 |
| 2001/0038151 | A1 | 11/2001 | Takahashi et al. | |
| 2007/0158857 | A1 | 7/2007 | Mihara | |
| 2008/0246126 | A1 | 10/2008 | Bowles et al. | |
| 2009/0134528 | A1 | 5/2009 | Lee et al. | |
| 2013/0040423 | A1 | 2/2013 | Tung et al. | |
| 2015/0108656 | A1 * | 4/2015 | Juneja | H01L 23/13 257/774 |
| 2017/0053896 | A1 | 2/2017 | Yu et al. | |
| 2020/0176397 | A1 * | 6/2020 | Liu | H10P 72/74 |
| 2025/0314822 | A1 * | 10/2025 | Yu | G02B 6/13 |
| 2025/0316616 | A1 * | 10/2025 | Huang | H01L 23/585 |
| 2025/0347846 | A1 * | 11/2025 | Yu | G02B 6/12004 |

OTHER PUBLICATIONS

Examination Report under Section 18(3), UKIPO, Application No. GB2213545.3, mailed Aug. 6, 2024.

* cited by examiner

ELECTRONIC CIRCUIT FABRICATION

FIELD OF THE INVENTION

The field of representative embodiments of this disclosure relates to methods, apparatus and/or implementations concerning fabrication of electronic circuits or systems and to structures for supporting electrical components, devices and/or systems and to methods of fabricating such structures. In particular, the present application relates to structures for supporting integrated circuits (ICs) and to techniques for fabricating and packaging such structures.

BACKGROUND

Integrated circuits, in which one or more electronic components are formed on a single die or 'chip' of semiconductor material, are generally formed by wafer processing techniques. That is, a wafer of semiconductor material undergoes a sequence of processing steps in order to fabricate a plurality of individual circuits on the wafer. The processed wafer is subsequently diced thus creating a plurality of individual die.

Processing of multiple components at the same time in this way is advantageous, as it is cost effective and typically produces consistent and repeatable results. Batch processing (which may comprise single-wafer processing or the processing of multiple wafers) may include wafer level processing (WLP) techniques and/or non-wafer level processing techniques. Batch processing techniques are evolving rapidly, driven by the desire to streamline the manufacture, testing and packaging of semiconductor components and/or systems.

In many cases, each individual die may be individually packaged in its own package. However, in some cases it may be desirable to provide multiple dies within a single package. Various techniques for multi-chip packages, sometime referred to as multi-chip modules, have been proposed. In some examples, the various dies could be placed side-by-side on a suitable interposer, but this results in a relatively large package footprint or area. Stacked approaches have been proposed, such as fan-out integration package-on-package or chip-on-wafer techniques. However, such approaches can be costly and/or result in an increased footprint for the package, compared to the largest die and, in some cases may require the use of through silicon vias that can be very costly.

SUMMARY

Embodiments of the present disclosure relate to methods, structures and apparatus for fabrication of electronic circuits or systems, in particular, for electronic circuits comprising multiple dies in a stacked arrangement, and to the resultant electronic circuits or systems. Embodiments of the present disclosure may mitigate at least some of the aforementioned issues.

According to an aspect of the disclosure there is provided an electronic circuit package comprising:

- a primary integrated circuit die having a first surface and a second surface;
- a secondary integrated circuit die having a smaller area than the primary integrated circuit die, the secondary integrated circuit die being attached to a first surface of the primary integrated circuit die in a first location;
- a first set of electrical connectors, wherein each of the first set of electrical connectors extends from the first surface of the primary integrated circuit die outside the first location to a package connection layer to provide electrical connection between the package connection layer and the primary integrated circuit die; and
- an intermediate layer of dielectric or insulating material that extends between the first surface of the primary integrated circuit die and the package connection layer so that the dielectric or insulating material surrounds the first set of electrical connectors and there is at least some dielectric or insulating material between the second integrated circuit die and the package connection layer.

In some examples, the secondary integrated circuit die has a first surface and a second surface and the second surface of the secondary integrated circuit die may be mechanically coupled to the first surface of the primary integrated circuit die. A second set of electrical connectors may extend from the first surface of the secondary integrated circuit die to the package connection layer to provide electrical connection between the package connection layer and the secondary integrated circuit die. The intermediate layer of dielectric or insulating material may extend between the first surface of the secondary integrated circuit die and the package connection layer and surround the second set of electrical connectors. The primary integrated circuit die may be electrically connected to the secondary integrated circuit die via at least one of the first set of electrical connectors, the package connection layer and at least one of the second set of electrical connectors.

In some examples, the secondary integrated circuit die has a first surface and a second surface and the first surface of the secondary integrated circuit die may be mechanically and electrically coupled to the first surface of the primary integrated circuit die by a second set of electrical connectors that extend from the first surface of the secondary integrated circuit die to the first surface of the primary integrated circuit die. The intermediate layer of dielectric or insulating material may extend between the second surface of the secondary integrated circuit die and the package connection layer. The secondary integrated circuit die may be electrically connected to the package connection layer via at least one of the second set of electrical connectors, the first integrated circuit die and at least one of the first set of electrical connectors.

The dielectric or insulating material may comprise a moulding, adhesive or bonding material. The dielectric or insulating material may comprise a polymer or epoxy material. The dielectric or insulating material may comprise a cured lamination film, such as a cured die attach film.

In some implementations, the electronic circuit package may comprise a plurality of package contacts connected to a side of the package connection layer opposite to the intermediate layer of dielectric or insulating material. The package contacts may be electronically connected to at least one of the primary integrated circuit die and the secondary integrated circuit die via the package connection layer. One or more of the package contacts may be located in an area of the package connection layer that corresponds to the first location. A first surface of the package may be provided by the side of package connection layer connected to the package contacts, a second surface of the package may be provided by the second surface of the primary integrated circuit die and sidewalls of the package may be partly provided by sidewalls of the primary integrated circuit die and partly provided by sidewalls of the intermediate layer of dielectric or insulating material.

In some examples, the primary integrated circuit die may comprise at least one of a different process node size and a different semiconductor material to the secondary integrated circuit die.

In another aspect there is provided a method of forming an electronic circuit package comprising:

taking a primary wafer having a first surface and a second surface, wherein the primary wafer comprises one or more integrated circuits in respective circuit areas and comprises, for each circuit area, a first set of electrical connectors outside of a first location that extend from the first surface of the wafer to a first plane;

for each circuit area, attaching a secondary integrated circuit die to the first surface of the primary wafer in the first location;

forming an intermediate layer of dielectric or insulating material that extends between the first surface of the primary wafer to the first plane so that, for each circuit area, the dielectric or insulating material surrounds the first set of electrical connectors and there is at least some dielectric or insulating material between the second integrated circuit die and the first plane; and forming, for each circuit area, a package connection layer over the intermediate layer of dielectric or insulating material.

The secondary integrated circuit die may have a first surface and a second surface and a second set of electrical connectors may extend from the first surface of the secondary integrated circuit die.

In some examples, the step of attaching a secondary integrated circuit die to the first surface of the primary wafer may comprise mechanically coupling the second surface secondary integrated circuit die to the first surface of the primary wafer such that the second set of electrical connectors extend from the first surface of the secondary integrated circuit die to the first plane. The intermediate layer of dielectric or insulating material may be formed to extend between the first surface of the secondary integrated circuit die and the first plane and surround the second set of electrical connectors. The package connection layer may be formed such that, for each circuit area, the primary wafer is electrically connected to the secondary integrated circuit die via at least one of the first set of electrical connectors, the package connection layer and at least one of the second set of electrical connectors.

In other examples, the step of attaching a secondary integrated circuit die to the first surface of the primary wafer may comprise mechanically and electrically coupling the first surface of the secondary integrated circuit die to the first surface of the primary wafer by the second set of electrical connectors. The intermediate layer of dielectric or insulating material may be formed to extend between the second surface of the secondary integrated circuit die and the first plane. The secondary integrated circuit die may be electrically connected to the package connection layer via at least one of the second set of electrical connectors, the first integrated circuit die and at least one of the first set of electrical connectors.

The dielectric or insulating material may comprise a moulding, adhesive or bonding material. The dielectric or insulating material may comprise a polymer or epoxy material.

In some examples, the dielectric or insulating material may be applied as fluid or a film so as to, for each circuit area, flow around and over the secondary integrated circuit die and the first set of electrical connectors and then cured or treated to set or hardened. The dielectric or insulating material may be applied as a lamination film, for instance by lamination of a die attach film. The method may comprise introducing the dielectric or insulating material as a film, applying pressure and/or heat to the film to cause the material of the film to flow around and over the secondary integrated circuit die and the first set of electrical connectors and then curing the film.

The method may further comprise forming a plurality of package contacts on a side of the package connection layer opposite to the intermediate layer of dielectric or insulating material, wherein the package contacts are electronically connected to at least one of the primary integrated circuit die and the secondary integrated circuit die via the package connection layer. One or more of the package contacts may be located in an area of the package connection layer that corresponds to the first location.

The method may further comprise dicing the primary wafer into individual die corresponding to each circuit area. The primary wafer may comprises alignment marks to aid in dicing the primary wafer and the intermediate layer of dielectric or insulating material may be formed to be sufficiently transparent to allow the alignment marks to be observed at visible wavelengths.

The primary wafer may comprise at least one of a different process node size and a different semiconductor material to the secondary integrated circuit die.

In a further aspect there is provided an electronic circuit package comprising:

a primary integrated circuit die having a first surface and a second surface;

a secondary integrated circuit die having a smaller area than the primary integrated circuit die, the secondary integrated circuit die being attached to a first surface of the primary integrated circuit die in a first location;

a first set of electrical connectors, wherein each of the first set of electrical connectors extends from the first surface of the primary integrated circuit die outside the first location to a package connection layer to provide electrical connection between the package connection layer and the primary integrated circuit die; and an intermediate layer of dielectric or insulating material that extends between the first surface of the primary integrated circuit die and the package connection layer so that the dielectric or insulating material surrounds the first set of electrical connectors and the second integrated circuit die.

It should be noted that, unless expressly indicated to the contrary herein or otherwise clearly incompatible, then any feature described herein may be implemented in combination with any one or more other described features.

BRIEF DESCRIPTION OF DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to electronic circuits and/or systems and to methods of manufacture thereof, and in particular to electronic circuit structures, such as electronic circuit packages, comprising multiple integrated circuit dies. In particular, but not exclusively, aspects relate to structures for supporting miniaturised components, devices and/or systems which incorporate semiconductor material, for example integrated circuits (IC's). Some aspects provide support structures which are particularly suitable for wafer level and/or batch level processing techniques. Aspects also relate to package designs and to wafer level packaging techniques.

Figure 1A:
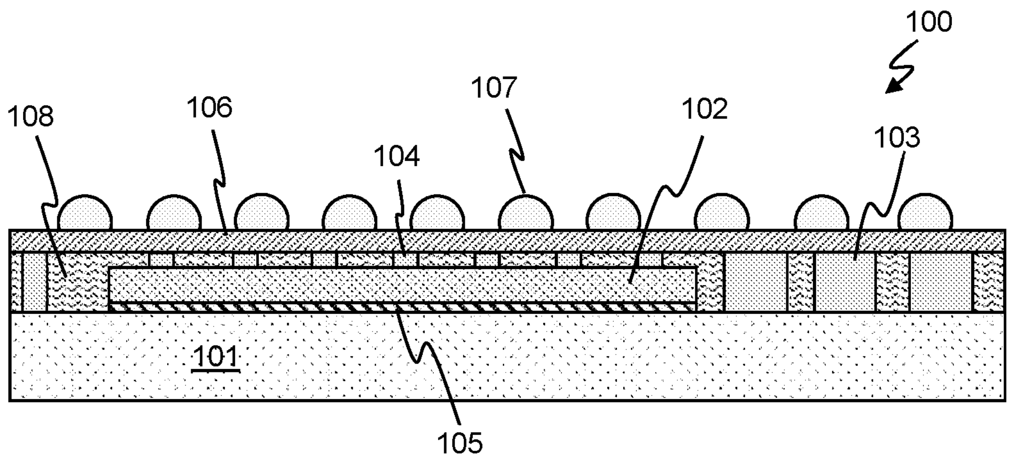
FIGS. 1*a* and 1*b* illustrate, respectively, cross sectional and plan views of an example of an electronic circuit package according to an embodiment.

FIG. 1*a* illustrates a cross sectional or side view of one example of an electronic circuit package 100 according to an embodiment, where the package 100 includes multiple integrated circuit (IC) dies. The electronic circuit package 100 is a wafer-level chip-scale-package (WLCSP) including multiple stacked IC dies.

In the example of FIG. 1*a*, the package 100 comprises a primary IC die 101 and a secondary IC die 102. The primary IC die 101 may comprise integrated circuitry and thus may comprise a semiconductor substrate which has been processed to form desired circuitry. A first set of a plurality of conductive connectors 103, such as metallic conductive posts, extend from a first surface of the primary IC die 101 to provide a first set of electrical connections with the circuitry of the first IC die. In some examples the first surface of the primary IC die 101 may comprise a redistribution layer (RDL) (not separately illustrated) to provide suitable connectivity between the conductive posts 103 and the circuitry of the primary IC die 101.

The secondary IC die 102, which is smaller in area than the primary IC die 101, may also comprise integrated circuitry and thus may also comprise a semiconductor substrate which has been processed to form desired circuitry. The secondary IC die 102 is mounted on, i.e. mechanically coupled to, the first surface of the primary IC die 101. A first surface of the secondary IC die 102 is coupled to a second set of a plurality of conductive connectors 104, such as metallic conductive posts, to provide electrical connectivity with the circuitry of the secondary IC die 102. In some examples the first surface of the secondary IC die 102 may comprise a RDL (not separately illustrated) to provide suitable connectivity between the conductive posts 104 and the circuitry of the primary IC die 102.

In the example of FIG. 1*a*, the secondary IC die 102 is coupled to the primary IC die 101 by a second surface of the secondary IC die (opposite the first surface), for instance via a suitable adhesive layer 105. Thus, in the example of FIG. 1*a*, the first surface of the primary IC die 101 and the first surface of the secondary IC die 102 have the same orientation, i.e. being the respective top surfaces as illustrated in FIG. 1*a*, and the conductive posts 103 and the conductive posts 104 both extend to a first surface of the package (which is the top surface as illustrated in FIG. 1*a*), which, in this example, comprises a package redistribution layer (RDL) 106. The height of the first set of conductive posts 103 and the height of the second set of conductive posts 104 are thus set with regard to the height of secondary IC die 102 (when mounted on the first IC die 101) so that the first and second sets of conductive posts 103 and 104 both extend to substantially the same plane, for making connections to the package RDL 106, which plane is spaced apart from the first surface of the secondary die 102. The conductive posts 103 that extend from the first surface of the primary die 101 thus have a height which is greater than the height of the secondary die 102.

The package RDL 106 provides appropriate electrical connections between the conductive posts 103, the conductive posts 104 and package contacts 107, which may, for instance, comprise solder balls or bumps for bump bonding. In some examples, the package RDL 106 may provide one or more electrical connections between the conductive posts 103 and the conductive posts 104 to provide some electrical connectivity between the primary IC die 101 and secondary IC die 102 within the package 100. In the example of FIG. 1*a* there may thus be no significant electrical signal path connectivity between the secondary IC die 102 and the primary IC die via the second surface on the secondary IC die and any electrical connectivity between the primary IC die 101 and the secondary IC die 102 may be via the package RDL 106, which is separated from both the primary IC die 101 and the secondary IC die 102. The package RDL 106 can also provide one or more electrical connections between the conductive posts 103 and the package contacts 107 and/or between the conductive posts 104 and the package contacts 107 to allow electrical connectivity between the package contacts 107 and at least one of the primary IC die 101 and the secondary IC die 102.

This arrangement can be referred to as a face-up (or face-out) configuration for the secondary die, as the first surface of the secondary IC die 102 faces in the same direction as the first surface of the primary IC die 101, towards the first surface of the electronic circuit package 100 that carries the package contacts 107. As will be described in more detail below, it is possible, however, to implement a face-down configuration for the second circuit die 102, where the first surface of the secondary die 102 faces the first surface of the primary die and electrical contact is made between the first surface of the secondary IC die 102 and the first surface of the primary IC die 101.

Surrounding the secondary IC die 102, and the connective posts 103 and 104, is a layer of insulating or dielectric material 108. The insulating/dielectric material 108 encapsulates the secondary IC die 102 and the conductive posts 103 and 104 and can be seen as an intermediate layer that extends from the first surface of the primary IC die 101 to the opposite ends of the conductive posts 103, i.e. to RDL 106, and which covers the secondary IC die 102. At least some of the insulating/dielectric material 108 thus covers the first surface of the secondary IC die 102, i.e. the insulating/dielectric material 108 is also an intermediate layer between the secondary IC die 102 and the package RDL. In this example the secondary IC die 102 is thus isolated mechanically and electrically isolated from the package RDL by the insulating/dielectric material 108, other than via the conductive posts 104.

Figure 1B:
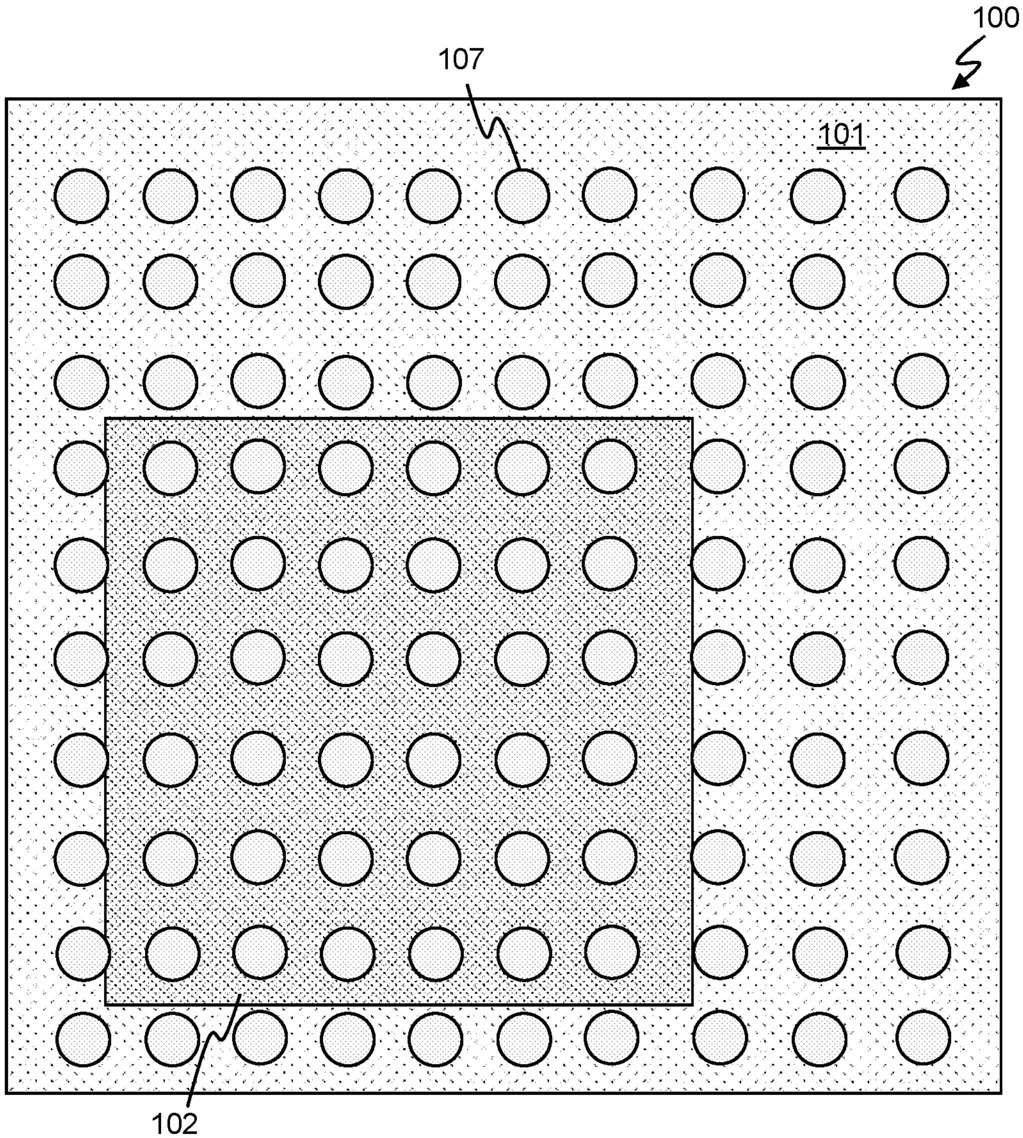

FIG. 1*b* illustrates a plan view of the package 100 illustrating the package contacts 107 and the positions of the primary IC die 101 and secondary IC die 102.

It can be seen from FIGS. 1*a* and 1*b* that the electronic circuit package 100 has an area or footprint which is substantially the same as that of the primary IC 101. The package is thus a chip-scale-package (CSP). The package contacts, i.e. balls or bumps 107, are arranged on the first surface of the package 100 (illustrated in FIG. 1*a* as the top surface), within the area defined by the primary IC die 101 and thus the package does not involve any fan out integration. The package contacts, i.e. balls or bumps 107, can be distributed across the whole of the area of the first surface of the package and may, as illustrated in FIG. 1*b*, be positioned within the area defined by the second IC die 102 (i.e. to overlie the secondary IC die 102 as illustrated).

The second surface of the package 100, opposite the first surface, may be defined by the second surface of the first IC die 101 (the bottom surface as illustrated in FIG. 1*a*), although in some embodiments the second surface of the first IC die may comprise some backside protection, e.g. one or more protective layers (not separately illustrated) that may define the second surface of the package 100. The sidewalls of the package 100 may be partly defined by the sidewalls of the first IC die 101 and partly by the intermediate layer of dielectric or insulating material 108.

The electrical connections between the package contacts 107 and the first and second IC dies 101 and 102 may be provided by RDL 106 and conductive posts 103 and 104 respectively, and no through-silicon-vias (TSVs) are required. In some embodiments the ability to implement a face-up (or face-out) configuration for the secondary die without requiring the use of any TSVs can be advantageous, but it should be noted that in some embodiments at least some electrical connectivity between the first and second IC dies 101 and 102 may be provided by a TSV (not illustrated) though the secondary die 102 which makes electrical connection to the first surface of the primary IC die 101. In this case, the second surface of secondary IC die 102 may be secured to the first surface of the primary IC die 101 by any suitable method that provide a suitable electrical connection, such as by means of soldering, e.g. reflow or thermal compression bonding. Alternatively it could be attached by means of conductive adhesive such as epoxy, sintering material, or Cu to Cu hybrid bonding, etc.

The electronic circuit package 100 of FIGS. 1*a* and 1*b* comprises multiple IC dies, in this example primary and secondary IC dies 101 and 102, although it will be understood that in some cases additional IC dies could be located in different positions on the first surface of the primary IC die 101 and/or at least one additional IC die could possibly be mounted on the first surface of the secondary IC 102.

Providing at least two IC dies as part of the same package may be advantageous for a number of different reasons, depending on the particular application. In some instances, packaging first and second IC dies 101 and 102 together may provide an electronic circuit package 100 with a certain overall functionality and with a smaller footprint than if the same combined functionality were provided by just one single IC die packaged on its own. In some examples, some functionality could be provided by one of the IC dies, with the other IC die providing some additional functionality that could, for instance, be optional or selective. For instance, the primary IC die 101 could provide some base functionality, with the second IC die providing some additional functionality. In some instances, if the additional functionality is not required, the primary IC die 101 could be used on its own and packaged without a secondary IC die 102. Where the additional functionality is required, the primary IC die 101 could be packaged with the secondary IC die 102. In some cases the primary IC die 101 could be selectively packaged with different secondary IC dies to provide different additional functionality. In some cases, this could allow redesign of the secondary IC die to be made, without the need for any redesign of the primary IC die, or vice versa.

Separating the functionality between different IC dies may also allow each die to be optimised for that particular functionality. For instance, the different IC dies could be manufactured with different process nodes. For instance, if one die comprises circuitry that is predominantly for digital processing, it may be manufactured with a process node which is optimal for digital processing, whereas if the other die comprises circuitry that is predominantly for analogue processing, it may be manufactured with a different process node. Thus, purely by way of example, one of the IC dies could have a process node of 22 nm and the other IC die could have a process node of 55 nm. Additionally or alternatively, whilst in some applications each of the primary and secondary IC dies may be formed from the same semiconductor material, whether silicon or a compound semiconductor, in some applications the different IC dies could be fabricated from different semiconductor materials. Some semiconductor materials may have particular advantages for certain applications, thus compound semiconductor materials such as gallium arsenide (GaAs) or gallium nitride (GaN) may have advantages over single element semiconductors, such as silicon, for some applications.

In general, for an electronic circuit package 100, the different IC dies within the package may be selected and mixed according to the particular application that the electronic circuit package 100 is intended for, as will be appreciated by one of ordinary skill in the art.

Note that, for the avoidance of doubt, the term primary is used herein in relation to the dies to refer to the larger die that defines the footprint or area of the package and on which the smaller die is mounted, and the term secondary is likewise used to refer to the smaller die which is mounted on the larger die and nothing is meant or should be implied regarding the functionality or use of the relevant circuits.

Figure 2:
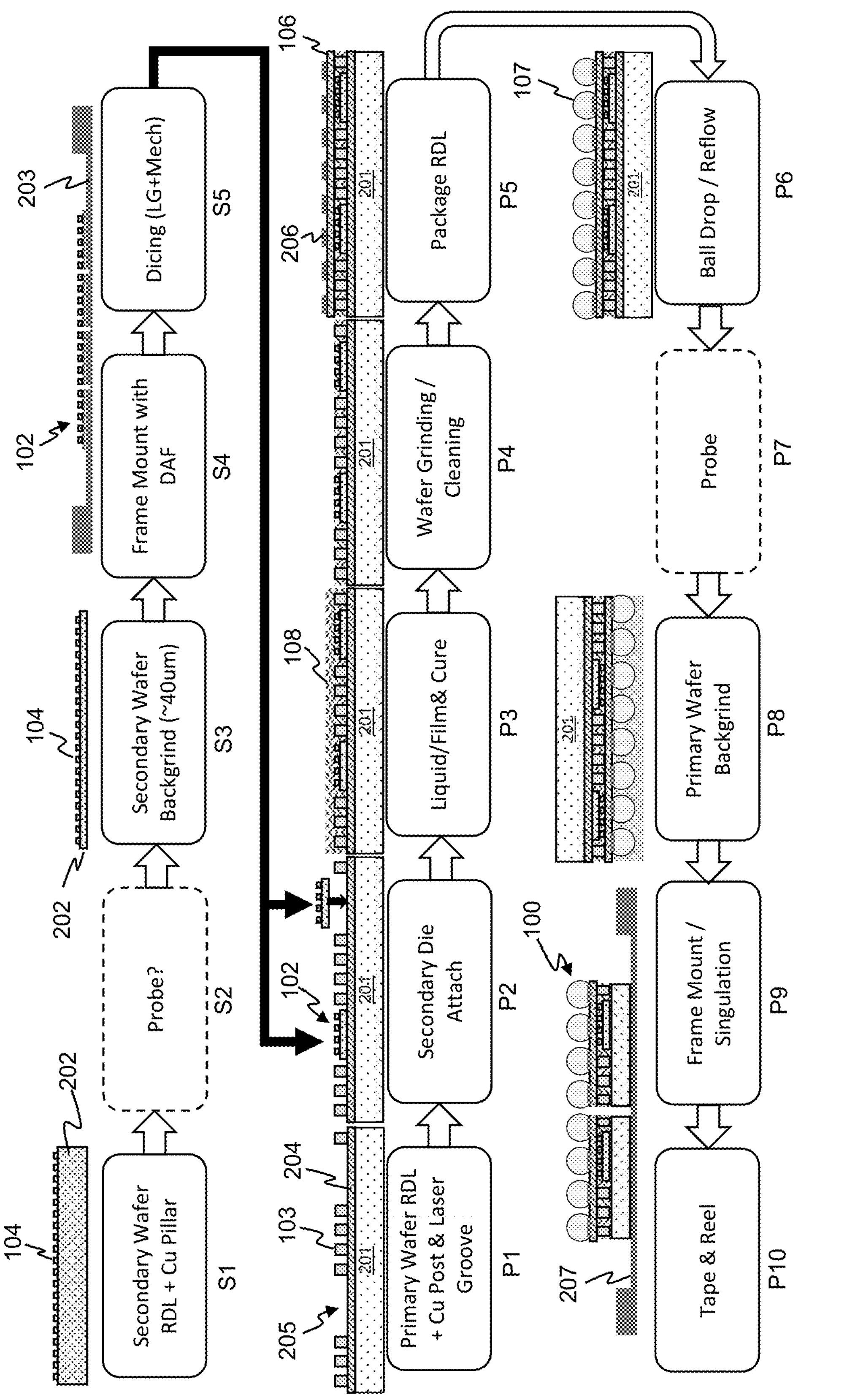
FIG. 2 illustrates one example of a process flow for fabricating the electronic circuit package of FIG. 1*a*.

FIG. 2 illustrates one example of a process flow for fabricating the electronic circuit package 100 of FIG. 1*a*. FIG. 2 illustrates that a primary wafer 201 may be processed using wafer-level processing techniques and that also a secondary wafer 202 may be separately processed to form the secondary IC die 201.

The processing of the secondary wafer 202 will be described first. A first step, S1, introduces a secondary wafer 202 which is processed using any suitable known semiconductor processing steps to form at least one desired integrated circuit, and conveniently wafer level processing is applied to form a plurality of integrated circuits in distinct areas of the secondary wafer 202. The processing may thus form a plurality of integrated electronic components. In step S1, a plurality of suitable connectors, such as conductive posts 104, in this example copper (Cu) pillars, are also formed on the first surface of the secondary wafer 202 to allow for electrical connection to the integrated circuitry formed on the secondary wafer 202. In some cases the first surface of the secondary wafer 202 may comprise a redistribution layer (RDL) (not separately illustrated) for connecting the conductive posts 104 appropriately to the integrated circuitry of the secondary wafer.

In some example process flows, there may optionally be a step S2 where the secondary wafer 202 is probed to test the functionality of each of the individual integrated circuits, as would be understood by one skilled in the art. Any defective circuits can be identified so as not to be used/removed in further processing.

In step S3, the height of the secondary wafer 202 may be reduced, so as to reduce the height of the resulting secondary die 102. The secondary wafer 202 may be thinned, for example, by backgrinding of the second surface of the secondary wafer. Keeping the secondary die 102 relatively thin is generally advantageous in terms of reducing the overall height of the final stacked package and avoiding the need for a relatively thick layer of insulating/dielectric material to encapsulate the secondary die.

In steps S4 and S5, the secondary wafer 202 may be attached to a suitable carrier, such as a frame and die attach film (DAF) 203. The secondary wafer 202 may then be singulated, e.g. diced, into individual secondary dies 102, each on a suitable DAF.

Turning now to the processing of the primary wafer 201, in step P1 a primary wafer 201 is introduced which is processed using any suitable known semiconductor processing steps to form at least one desired integrated circuit, and conveniently wafer level processing is applied to form a plurality of integrated circuits in distinct areas of the primary wafer 201. The processing may thus form a plurality of integrated electronic components. In step P1, a plurality of suitable connectors, such as conductive posts 103, in this example copper (Cu) pillars, are also formed on the first surface of the primary wafer 201 to allow for electrical connection to the integrated circuitry formed on the primary wafer 201. In some cases the first surface of the primary wafer 201 may comprise a redistribution layer (RDL) 204 for connecting the conductive posts 103 appropriately to the integrated circuitry of the primary wafer. The height of the conductive posts 103 are controlled to be equal to the height of a secondary die 102 (plus DAF) and conductive posts 104 combined. The conductive posts 103 are arranged on the first surface of the primary wafer 201 so as to leave areas 205 within each distinct integrated circuit for receiving the secondary dies and the primary wafer 201 is processed so as to form a suitable surface for receiving the secondary dies. One or more alignment markers (not illustrated) may be formed as part of the primary wafer by any suitable process as would be understood by one skilled in the art. Such alignment markers may be useful for later processing steps, for instance as guides for singulation/dicing of the primary wafer 201. In step P1 some laser grooving may be performed, e.g. to remove material from the dicing streets.

In step P2 the one or more individual secondary dies 102 are attached to the primary wafer 201 in the relevant locations. The secondary dies 102 may, for instance, be attached to the primary wafer 201 using suitable pick-and-place techniques as would be understood by one skilled in the art.

For the face-up configuration illustrated in FIG. 1*a*, the secondary die 102 may be mechanically connected to the primary wafer, for instance via the adhesion of the DAF. For a face-down configuration, the secondary die may be electrically connected to the RDL 204 of the primary wafer via the conductive posts 104.

In step P3, the first surface of the primary wafer, the conductive posts 103 and the secondary die 102 (and for a face up configuration the conductive posts 104) are covered with an insulating or dielectric material 108, such as, for example a moulding, adhesive or bonding type material.

The moulding, adhesive or bonding type material may comprise, for example, a polymer or epoxy type material and is preferably a hardenable, settable or curable material which may be applied in liquid form and/or film form and which, when hardened, serves to secure, cover and insulate the plurality of secondary dies 102 and the conductive posts 103 (and 104) and, where present the RDL 204 of the primary wafer.

Hardening of the moulding, adhesive or bonding type material may be by heat and/or pressure and/or ultraviolet light for example.

In some cases, the dielectric/insulating layer 108 may be provided using a lamination film. As will be understood by one skilled in the art, lamination films comprise films of material that can be applied to the first surface of the primary wafer and which flows under the action of heat and/or pressure. The lamination film may be introduced to the first surface of the primary wafer and pressure and/or heat applied, e.g. using vacuum lamination techniques, so that the adhesive/bonding material flows so as to encapsulate the secondary die and conductive posts 103 and 104 on the surface of the primary wafer 201.

Such lamination films can be advantageous, in that the film material may flow at relatively low pressures and/or temperatures and thus reduce the risk of damage to the circuitry. Use of lamination film can result in an even application of insulating/dielectric material 108 across the surface of the primary wafer without voids and the lamination film can provide a thick enough intermediate layer of material 108 to fully encapsulate the secondary die 102 on the first surface of the primary wafer. Conventional spin coating techniques for depositing dielectric material would not generally be able to provide a thick enough layer to embed the secondary die 102 as desired. Lamination films may also avoid issues of warpage that could be experienced with some mold materials used in conventional CSP techniques. Examples of suitable lamination films are, without limitation, Lintec (Adwill) LC2850 or Ajinomoto GX92. The use of lamination films for embedding a secondary die on the surface of a primary die as part of a CSP package represents one particular aspect of the present disclosure. Some lamination films may also be described as die attach films.

In some cases, however, the insulating/dielectric material 109 could be a polymer, such as the HDM 4100 series or Fujifilm 9300 series, dispensed over the surface of the primary wafer 201 in a liquid form and then cured, or a mold material such as Sumitomo G730, which again may be dispensed in fluid form and cured.

In some cases it can be advantageous for the insulating/dielectric material 108 to be relatively transparent when cured, at least so as to be transparent enough when thinned (as discussed with respect to step P4 below) so that the alignment marks discussed with reference to step P1 are visible through the layer of insulating/dielectric material 108 at visible wavelengths, as this can ease subsequent location of the alignment marks, e.g. without requiring infrared inspection or the like.

In step P4, the first surface of primary wafer which is covered with the insulating/dielectric material 108 is ground and cleaned so as to planarise the insulating/dielectric material 108 and expose the connectors, i.e. conductive posts 103, of the primary wafer 201, and where present, the connectors, i.e. conductive posts 104 of the secondary dies.

In step P5 a suitable package redistribution layer 106, with under bump metallisation 206 is added to the top of the intermediate layer 108 to make appropriate connections between the conductive posts 103 and 104 and under bump metallisation.

In step P6 suitable package connectors, in this example ball connections 107, are connected to the under-bump metallisation 206 of the redistribution layer 106.

Step P7 is an optional process step wherein the primary wafer 201 may be probed to determine correct functionality of the various IC dies, i.e. to test the combination of an integrated circuit of the primary wafer 201 with its associated secondary IC die 102, as will be understood by one of ordinary skill in the art. Any defective circuits can be identified so as not to be used/removed in further processing.

In step P8 the height of the primary wafer 201 is reduced. The primary wafer may be thinned, for example by backgrinding as will be understood by one of ordinary skill in the art. Reducing the height of the primary wafer can reduce the overall height of the resultant electronic circuit package 100.

Steps P9 and P10 is where the primary wafer 201 is attached to a suitable carrier, such as a frame and dicing tape 207, and then singulated or diced to produce a plurality of individual electronic circuit packages 100. As discussed above, if the layer of dielectric/insulating material 108 is sufficiently transparent to allow the alignment markers to be observed at visible wavelengths, that may simplify the processing required at the singulation stage. The individual electronic circuit packages 100 may then be transferred to a carrier tape and reeled for subsequently supply and use.

The process flow described with reference to FIG. 2 is thus a process flow that is fully compatible with wafer-level-processing and/or batch processing. The processing to form the secondary die is performed on a secondary wafer 202 and the processing to form the primary die packaged with the secondary die is performed on a primary wafer 201. No special panels or carriers or the like are required for forming either of the primary or secondary dies or the combined structure/package, only a conventional frame mount for singulation. It will, of course, be understood that whilst the process flow of FIG. 2 shows processing of both the secondary wafer and the primary wafer, the processing of the secondary wafer can be, but need not be, contemporaneous with the processing of the primary wafer. The secondary wafer 202 could be, at least partly, processed, in a separate, earlier, stage of processing, and it is sufficient that the secondary IC dies are available for placement on the primary IC die during step P2 of processing of the primary wafer 201. In some cases, at least part of the processing of the secondary wafer 202 may be performed remotely from the processing of the primary wafer, with the processed secondary wafer 202 or individual secondary IC dies 102 being supplied for use in the processing of the primary wafer.

Figure 3:
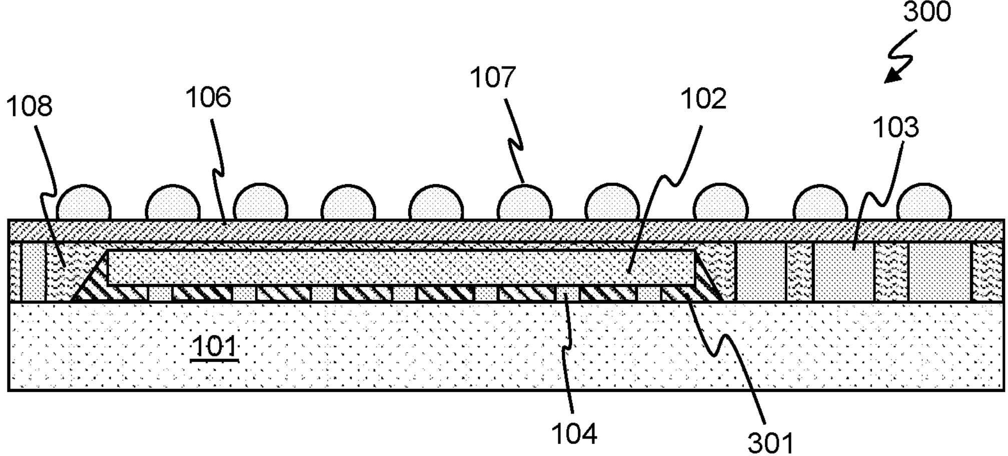
FIG. 3 illustrates a cross sectional view of another embodiment of an electronic circuit package.

As noted above, the example electronic circuit package 100 illustrated in FIG. 1*a* shows a face-up configuration where the primary IC die 101 and secondary IC die 102 both face in the same direction. FIG. 3 illustrates a cross section or side view of an alternative example of an electronic circuit package 300, in which similar components are identified with the same references, where the secondary IC die 102 is configured face-down, i.e. with its first surface, bearing the connecting conductive posts 104, facing the first surface of the primary IC die 101. In this case the conductive posts 104 provide electrical connection between the secondary IC die 102 and the primary IC die 101. Electrical connection between the package contacts 107 and the secondary IC die 102 and may thus be established via the package RDL layer 106, conductive posts 103, the primary IC die 101 (e.g. via a RDL of the primary IC die 101) and the conductive posts 104.

In at least some embodiments, as illustrated in FIG. 3, the height of the conductive posts 103 that extend from the first surface of the primary die 101 is greater than the combined height of the secondary IC die 102 and conductive posts 104. Thus, in this example, the conductive posts extend further away from the first surface of the primary die 101 than the secondary die 102 (when mounted on the primary die). In other words, the conductive posts 103 extend from the first surface of the primary die 101 to a connection plane (where the package RDL 106 is) which is further away from the first surface of the primary die 101 than the second surface of the secondary die 102. Therefore, some insulating/dielectric material 108 is located between the second surface of the secondary IC die 102 and the connection plane and the secondary IC die 102 isolated mechanically and electrically from the package RDL via the insulating/dielectric material 108.

Note in some alternative examples, a ground, or other reference voltage, connection could be made to the second surface of the secondary IC die 102 via the package RDL, and in such embodiments with an active electrical connection to the second surface of the secondary IC die 102, the connection plane could be at the same level as the second surface of the secondary IC die 102. In such embodiments there may be no insulating/dielectric material 108 located between the second surface of the secondary IC die 102 and the connection plane/package RDL 106.

Fabrication of the electronic circuit package 300 of the example of FIG. 3 may follow the same general process flow as discussed with reference to FIG. 2, but in step P2 the secondary dies 102 are placed onto the primary wafer 201 face down, so that the conductive posts 104 make electrical contact between the first surface of the secondary die 102 and the first surface of the primary wafer 102.

The secondary IC dies 102 may be secured to the primary wafer 201 by any suitable method, such as by means of soldering, e.g. reflow or thermal compression bonding. Alternatively they could be attached by means of conductive adhesive such as epoxy, sintering material, or Cu to Cu hybrid bonding, etc. In some embodiments an insulating material 301 may optionally be provided, for instance dispensed, to provide an underfill material between the conductive pillars 104.

The electronic circuit package 300 of FIG. 3 thus also may be manufactured in a process which is fully compatible with wafer-level and/or batch processing.

The description above has focussed on the primary and second dies 101 and 102 comprising integrated circuitry. It should be understood that at least one of the dies could, in some examples, comprise some MEMS components or the like, either with or without any associated integrated circuitry and/or at least one of the dies could comprise a semiconductor based passive device, such as an IPD (integrated passive device) or deep trench capacitor or the like, and the term electronic circuit package and IC die should be understood accordingly.

Some embodiments relate to a semiconductor package comprising: a primary die comprising first and second surfaces wherein the first surface of the primary die comprises a first set of electrical connections; a secondary die comprising first and second surfaces and sidewalls wherein the first surface of the secondary die comprises second set of electrical connections and wherein the second surface of the secondary die is mechanically coupled to the first surface of the primary die; wherein the first surface of the primary die not coupled to the secondary die, the first set of electrical connections and the first surface, sidewalls and second set of electrical connections are coupled to an intermediate layer. Some embodiments relate to a semiconductor package comprising: a primary die comprising first and second surfaces wherein the first surface of the primary die comprises a first set of electrical connections; a secondary die comprising first and second surfaces and sidewalls wherein the first surface of the secondary die comprises second set of electrical connections and wherein the first surface of the secondary die is mechanically and electrically coupled to the first surface of the primary die via the second set of electrical connections; wherein the first surface of the primary die not coupled to the secondary die, the first set of electrical connections and the second surface and sidewalls of the second die are coupled to an intermediate layer.

The intermediate layer may be an insulating material. The intermediate layer may be a dielectric material. The intermediate layer may be a moulding, adhesive or bonding type material. The moulding, adhesive or bonding type material may comprise a polymer or epoxy type material. The polymer or epoxy type material may be a hardenable, settable or curable material. The hardenable, settable or curable material may be configured to be applied in liquid form and/or film form.

Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, or a video player. It will be understood that embodiments may be implemented as part of a system provided in a home appliance or in a vehicle or interactive display. There is further provided a host device incorporating the above-described embodiments.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A method of forming an electronic circuit package comprising:

taking a primary wafer having a first surface and a second surface, wherein the primary wafer comprises one or more integrated circuits in respective circuit areas and comprises, for each circuit area, a first set of electrical connectors outside of a first location that extend from the first surface of the wafer to a first plane;

for each circuit area, attaching a secondary integrated circuit die to the first surface of the primary wafer in the first location;

forming an intermediate layer of dielectric or insulating material that extends between the first surface of the primary wafer to the first plane so that, for each circuit area, the dielectric or insulating material surrounds the first set of electrical connectors and there is at least some dielectric or insulating material between the second integrated circuit die and the first plane; and forming, for each circuit area, a package connection layer over the intermediate layer of dielectric or insulating material.

2. The method of claim 1 wherein the dielectric or insulating material is applied as fluid or a film so as to, for each circuit area, flow around and over the secondary integrated circuit die and the first set of electrical connectors and then cured or treated to set or hardened.

3. The method of claim 1 wherein the step of forming the intermediate layer of dielectric or insulating material comprises applying a lamination film to the first surface of the primary wafer under heat and/or pressure and subsequently curing the lamination film.

4. The method of claim 1 further comprising dicing the primary wafer into individual die corresponding to each circuit area wherein the primary wafer comprises alignment marks to aid in dicing the primary wafer and wherein the intermediate layer of dielectric or insulating material is formed to be sufficient transparent to allow the alignment marks to be observed at visible wavelengths.

* * * * *